US005595943A

United States Patent [19]
Itabashi et al.

[11] Patent Number: 5,595,943
[45] Date of Patent: Jan. 21, 1997

[54] METHOD FOR FORMATION OF CONDUCTOR USING ELECTROLESS PLATING

[75] Inventors: Takeyuki Itabashi; Haruo Akahoshi, both of Hitachi; Akio Takahashi, Hitachiota, all of Japan

[73] Assignee: Hitachi, Ltd., Tokyo, Japan

[21] Appl. No.: 495,021

[22] Filed: Jun. 27, 1995

[30] Foreign Application Priority Data

Jun. 30, 1994 [JP] Japan .................................. 6-194060

[51] Int. Cl.$^6$ ............................................ H01L 21/28
[52] U.S. Cl. ........................ 437/230; 437/195; 427/98; 427/437
[58] Field of Search ............................ 437/230, 195; 427/98, 437, 438, 443.1

[56] References Cited

U.S. PATENT DOCUMENTS

| | | | |
|---|---|---|---|
| 4,695,489 | 9/1987 | Zarnoch et al. | 427/438 |
| 5,017,516 | 5/1991 | van der Putten | 437/230 |
| 5,198,389 | 3/1993 | van der Putten et al. | 437/230 |

OTHER PUBLICATIONS

J. Pukovic, "Feature–Scale Simulation of Resist Patterned Electrodeposition", IBM J. Res. Develop. vol. 37 No. 2, Mar. 1993, pp. 125–141.

J. Jacobs et al, "Oxygen–Diffusion–Size Effect in Electroles Metal Deposition", J. Electrochem. Soc. vol. 135, No. 11, Nov. 1993, pp. 2822–2827.

A. van der Putten et al, "Anisotropic Deposition of Electroless Nickel", J. Electrochem. Soc., vol. 140, No. 8, Aug. 1993, pp. 2229–2235.

A. Van der Putten et al, "Geometrical Effects in the Electroless Metallization of Fine Metal Patterns", J. Electrochem. Soc., vol. 140, No. 8, Aug. 1993, pp. 2221–2228.

*Primary Examiner*—John Niebling
*Assistant Examiner*—Thomas G. Bilodeau
*Attorney, Agent, or Firm*—Antonelli, Terry, Stout & Kraus

[57] ABSTRACT

A method for forming a conductor circuit is provided which comprises depositing and filling a conductor metal in recessions of insulator in the form of grooves or holes using an electroless plating solution, the conductor metal being deposited and filled in the recession to the same level as the surface of the insulator, wherein said electroless plating solution contains an inhibitor which inhibits the cathodic partial reaction which is a metal deposition reaction and the electroless plating is carried out with stirring the plating solution. Since the plating reaction automatically stops when the metal conductor 1 is formed up to the level of the surface of the insulator 2, a conductor circuit in which the surface of the metal conductor 1 and that of the insulator 2 are even and at the same level can be easily obtained. Furthermore, since the conductor circuits differing in thickness can be simultaneously formed on one substrate, the number of lamination in making multilayer circuit can be reduced and a multilayer circuit board of low electric resistance can be obtained.

3 Claims, 3 Drawing Sheets

5,595,943

METHOD FOR FORMATION OF CONDUCTOR USING ELECTROLESS PLATING

BACKGROUND OF THE INVENTION

1. Field of the Invention

The present invention relates to conductor circuits formed by electroless plating such as printed circuit boards, module circuit boards and LSI and a method for formation thereof.

2. Description of Prior Art

Hitherto, in a method for forming conductor circuits by depositing a metal at the bottom of grooves or holes formed in an insulator, namely, having a recessed section and filling the metal in the grooves or holes by electroless plating, control of the thickness of the built-up plating film has been conducted in the following manner. As controls, a plurality of test pieces having grooves or holes of the same structure as of the desired circuit board are introduced into a plating bath together with the desired circuit board. These test pieces are successively taken out with lapse of time and thickness of the plating film formed on the test pieces is calculated by electrolytic process or by measurement of weight. This has been conducted based on the assumption that the film thickness formed on the test piece and that on the desired circuit board are formed at the same speed.

However, according to the above method, errors necessarily occur because the circuit board and the test piece are not electrically connected, and especially, it is very difficult to determine the end point of the plating. Therefore, it is necessary that a plating thicker than desired is applied and the plated conductor portion rising from protrusions of the grooves or holes is abraded to make the plated surface of that portion to have the same level as the surface of the insulator. That is, an abrasion step has been necessary.

Furthermore, it has been impossible to simultaneously form conductor metal circuits differing in thickness by electroless plating on the same substrate. This is because when circuits are formed on the same substrate, it is impossible to control the plating speed and the plating time for each of the circuits having different thickness. At present, only the method of forming conductor circuits differing in thickness on the same substrate by electroless plating is to carry out the plating separately.

That is, a plating condition is set which is suitable for plating of the thinnest conductor circuit, and the first plating is carried out and then, the substrate is taken out from the electroless plating bath and the portion which has reached the desired thickness is masked with a plating resist. Thereafter, again a plating condition is set which is suitable for plating of the next thinner conductor circuit and the second plating is carried out. This operation must be repeatedly carried out as many as the times corresponding to the number of the portions differing in thickness of conductor circuits. Therefore, the above method of forming conductor circuits differing in thickness on the same substrate is very troublesome and has never been practically employed.

J. Electrochem. Soc., 140(8), 2229 (1993) discloses a method of electroless nickel plating with a plating solution in which an inhibitor for the cathodic partial reaction is dissolved. In this method, the nickel film formed on a flat substrate surface is prevented from producing a sharp difference in level from the surface of the substrate by adding an inhibitor for the cathodic partial reaction and a conical nickel deposit 5 of very gentle shape as diagrammatically shown in FIG. 6 is formed.

Furthermore, in the case of a conductor circuit in which recessions such as grooves or holes on the surface of the insulator are filled by electroless plating, as mentioned above, the surface is flattened by abrasion and as a result, the surface of the conductor circuit is poisoned at the time of abrasion or is oxidized when left in air. Therefore, when another conductor circuit is formed on such conductor circuit, the surface of the conductor circuit must be cleaned by etching or the like. However, it is difficult to control etching quantity at constant and if the etching is insufficient, the poisoned layer or oxide layer remains on the surface of the under conductor circuit to lower the adhesion to the upper conductor circuit to cause increase of contact resistance. If the etching is excessive, this causes formation of uneven surface of the upper conductor circuit or insufficient film thickness of the upper conductor circuit.

SUMMARY OF THE INVENTION

The first object of the present invention is to provide a conductor circuit in which the surface of the insulator and that of the conductor circuit formed in recessions of the insulator form a substantially flat plane and which can be obtained without a flattening step such as abrasion.

The second object of the present invention is to provide a method for making a conductor circuit in which the surface of the insulator and that of the conductor circuit formed in recessions of the insulator form a substantially flat plane, thus no flattening step such as abrasion being required.

The third object of the present invention is to provide conductor circuits which differ in conductor metal film thickness and are simultaneously formed by electroless plating on the same substrate.

The fourth object of the present invention is to provide a method for forming conductor circuits which comprises simultaneously forming conductor circuits differing in film thickness on the same substrate.

The fifth object of the present invention is to provide a conductor circuit of multilayer which is formed easily.

The sixth object of the present invention is to provide a method for forming a conductor circuit which makes it easy to form the conductor circuit in multilayer.

BRIEF DESCRIPTION OF THE DRAWINGS

FIG. 4 is a diagrammatic cross-sectional view of a circuit part which shows the state of diffusion of the inhibitor when the surface of the deposited metal reaches the same level as the surface of a plating resist or the like.

DETAILED DESCRIPTION OF PREFERRED EMBODIMENTS

According to the present invention, it has been found that when an electroless plating solution containing an inhibitor for cathodic partial reaction in addition to a metal for conductor circuit is used for forming a conductor circuit in recessions on an insulating substrate such as grooves and holes, the surface of the circuit of the conductor metal filled in the recessions and the surface of the insulating substrate form the same plane.

The conductor circuit of the present invention has the following features.

(1) A conductor circuit obtained by depositing and filling a conductive metal in recessions provided at an insulating substrate such as grooves and holes by electroless plating where the surface of the conductor circuit and the surface of the insulating substrate form one same plane and said conductor circuit is covered with an electroless plating layer containing at a high concentration an inhibitor for cathodic partial reaction of electroless plating.

(2) The above conductor circuit may comprise a plurality of circuits provided on one insulating substrate and differing in thickness.

The method for forming a conductor circuit according to the present invention has the following features.

(3) An insulating substrate is dipped in an electroless plating solution containing an inhibitor for cathodic partial reaction of electroless plating and the conductive metal is deposited and filled in the recessions provided at the insulating substrate such as grooves and holes under stirring of the plating solution, thereby to form a conductor circuit having the surface which forms one same plane with the surface of the insulating substrate.

(4) In the above method, concentration of the inhibitor in the electroless plating solution is $1 \times 10^{-6}$ to $2 \times 10^{-4}$ mol/l.

(5) In the above method, the inhibitor is at least one of mercury, silver, zinc, tin, lead, iron, cobalt, arsenic, antimony, indium, cadmium, nickel and bismuth.

(6) In the above method, the electroless plating solution is a copper plating solution and the inhibitor is at least one of lead, mercury, silver, zinc, tin, iron, cobalt, nickel and bismuth.

Figure 1:
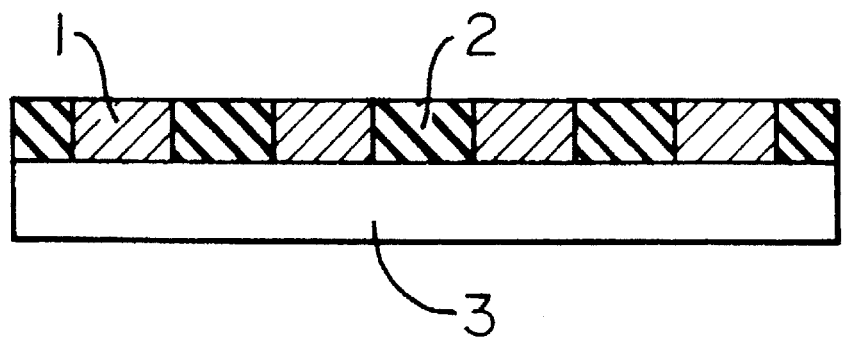
FIG. 1 is a diagrammatic cross-sectional view of a conductor circuit part of the present invention.

The characteristic of the present invention is that by adding to the electroless plating solution a material which inhibits the cathodic partial reaction of electroless plating, the electroless plating automatically stops when the plating surface reaches the same level as the surface of resist which controls width or position of the conductor circuit or the surface of the insulator (FIG. 1). In this case, however, it is necessary to stir the electroless plating solution for leveling the surface of the conductor and the surface of the insulating substrate. When the method of the present invention is employed, the conductor circuit can be formed without the abrasion step after plating which has hitherto been carried out.

The surface layer of the leveled conductor circuit formed upon automatic stopping of the electroless plating reaction is higher in content of the inhibitor than the inner portion. This difference in the content of the inhibitor between the inner portion and the surface portion of the conductor can be measured, for example, by analysis in the depth direction using Auger electron spectroscopy (hereinafter referred to as "AES") or secondary ion mass spectroscopy (hereinafter referred to as "SIMS") or by preparing a leaf sample of the section of the resulting conductor circuit by microtome method or ion milling method using a focused ion beam and observing it by a transmission electron microscope.

As the reaction inhibitors, at least one ion of mercury, silver, zinc, tin, lead, iron, cobalt, arsenic, antimony, indium, cadmium, nickel and bismuth is effective. In the case of copper plating, at least one ion of lead, mercury, silver, zinc, tin, iron, cobalt, nickel and bismuth is effective. In the case of nickel plating, at least one ion of lead, copper, mercury, zinc, tin, bismuth, antimony, cobalt, arsenic, indium and cadmium is effective. In the case of cobalt plating, at least one ion of lead, copper, mercury, zinc, tin, bismuth, antimony, nickel, arsenic, indium and cadmium is effective. Since the inhibitor is consumed by the electroless plating reaction, it is important to add the inhibitor in accordance with the amount of the deposited metal.

According to the present invention, thickness of the conductor circuit can be controlled only by setting the thickness of insulator constituting the circuit pattern (plating resist, etc.). The present invention can be applied to not only planar wiring boards, but also wirings having three-dimensional structure.

Figure 2:
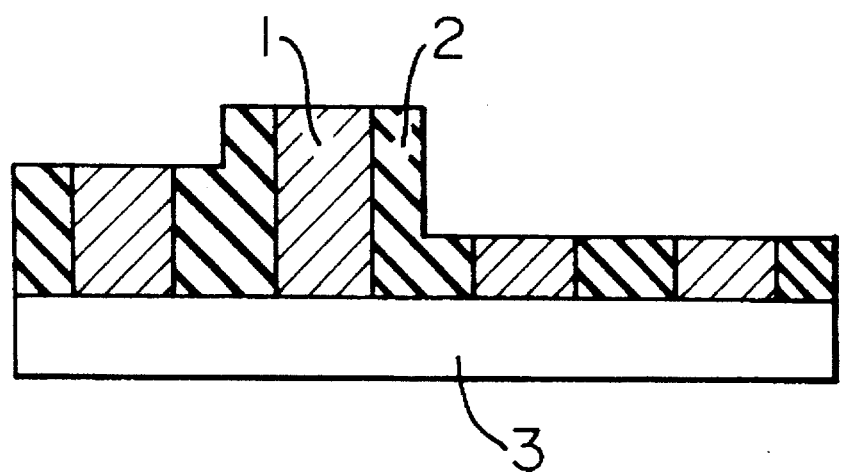
FIG. 2 is a diagrammatic cross-sectional view of a conductor circuit part of the present invention.

Furthermore, according to the present invention, conductor circuits of different thickness can be formed on the same substrate by one electroless plating by the automatic stopping of the electroless plating reaction (FIG. 2). Hitherto, this has been impossible. Accordingly, the number of substrates and production steps in making multilayer circuit boards can be diminished and the contact resistance as a whole can be reduced.

Moreover, the surface layer of the conductor metal containing the inhibitor in a large amount can be easily cleaned by etching the inhibitor, and therefore, when a conductor metal is further formed thereon, good connection can be attained. For example, when copper is formed as the conductor metal and lead is added as the inhibitor, the surface of the conductor circuit is covered with lead. When this substrate is dipped in an etching solution mainly composed of acetic acid, the copper as the conductor metal is hardly etched and the lead covering the surface can be easily etched. Therefore, there are no problems encountered in conventional methods, such as insufficient cleaning of the surface of the conductor circuit and excessive etching.

The automatic stopping function of electroless plating reaction which provides a conductor circuit free from the difference in level between the conductor metal and the insulator in the present invention is considered to be based on the following action. This will be explained with reference to electroless plating.

When a small amount of lead ion as an inhibitor for cathodic partial reaction which is a metal deposition reaction in plating is added to an electroless plating solution containing formaldehyde as a reducing agent, the lead codeposits in the deposited copper plating film. Since this lead inhibits the reducing reaction of copper ion which is the cathodic partial reaction of electroless copper plating, the copper deposition reaction does not proceed on the deposited lead. Accordingly, when the surface of the deposited copper is covered with lead, the electroless plating stops.

It is because flux of the inhibitor to the surface of plating resist or insulator becomes larger than that to the inside of the grooves or holes by stirring the electroless plating solution that the surface of the conductor metal formed upon automatic stopping of the electroless plating reaction is at nearly the same level as the surface of plating resist.

Figure 3:
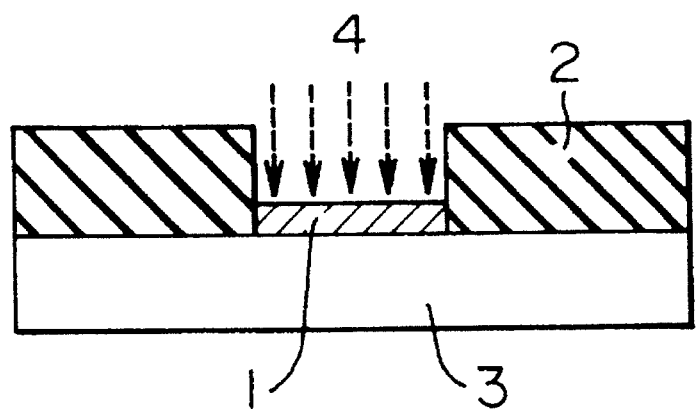
FIG. 3 is a diagrammatic cross-sectional view of a circuit part which shows the state of diffusion of an inhibitor for the cathodic partial reaction when a metal is deposited in recessions such as grooves and holes.

At the time of pattern plating by additive method or plating of the inside of via-holes, less convection of the plating solution occurs in the grooves or holes formed in the insulator which constitutes the pattern (such as plating resist), and flux of the reaction inhibitor, lead ion, is considered to be only the diffusion in planar direction as shown by arrow 4 in FIG. 3. It is especially effective to stir the plating solution so that the convection direction of the plating solution is in parallel to the substrate 3. The flux Ji (mol/cm$^2$·s) of lead to the plating surface in the grooves or holes can be expressed by the following formula [I] when diffusion constant of lead ion in the plating solution is indicated by Di, concentration of lead ion in the plating solution is indicated by $Ci^0$ (mol/cm$^3$) and thickness of diffusion layer is indicated by δ.

$$Ji = Di \times Ci^0 / \delta \qquad [I]$$

For example, when thickness of the diffusion layer is 50 μm, since the diffusion constant of the reaction inhibitor in the plating solution is generally about $2.0 \times 10^{-5}$ cm$^2$/s, Ji is as shown below according to the formula [I].

$$Ji = 4.0 \times 10^{-3} \times Ci^0 \text{ (mol/cm}^{-2}\text{·s)}$$

It is when the concentration of the inhibitor is in the range of about $1 \times 10^{-9} \leq Ci^0 \leq 2 \times 10^{-7}$ (mol/cm$^3$), namely, $1 \times 10^{-6} \leq Ci^0 \leq 2 \times 10^{-4}$ (mol/l) that the relation Ji<Jp is satisfied between the flux Ji and plating rate Jp (mol/cm$^{-2}$·s) since the plating rate is generally 0.2–20 μm/h.

Figure 4:
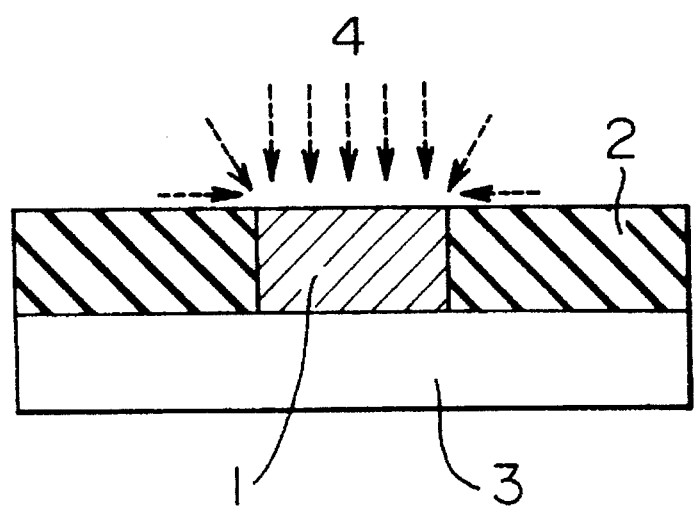

On the other hand, flux of lead ion to the surface of the conductor metal 1 when the plating surface reaches the level of the upper face of the grooves or holes is in the form of hemisphere due to the addition of edge effect as shown by arrow 4 in FIG. 4. Since the plating solution is stirred, flux of lead ion increases as much as many times. That is, when the surface of the conductor metal (copper plating) 1 reaches the level of the surface of insulator 2, the surface of copper plating is covered with lead ion and the plating reaction stops and it no longer proceeds. As a result, as shown in FIG. 1, a conductor circuit can be formed which has a flat surface free from difference in level or unevenness between the surface of the conductor metal 1 and the surface of the insulator 2.

In the above embodiment, lead ion is added as an inhibitor to an electroless plating solution, but the combination of the electroless plating solution and the inhibitor is not limited to this combination.

The inhibitor for electroless plating is a material which shifts the potential at which the metal deposition reaction takes place in the electroless plating solution to further cathodic side, in other words, a material which raises the overpotential of the metal deposition reaction. This material can be easily found by electrochemical measurements such as measurement of voltammogram. That is, this is a material which raises the overpotential of the metal deposition reaction of electroless plating in which the electroless plating reaction occurs. The inhibitor varies depending on the kind of the metal of electroless plating.

When the plating solution contains a complexing agent, in many cases the inhibitor also forms a complex. Therefore, it is necessary to consider not only the deposition potential, but also the stability constant of the complex. That is, the inhibition of plating reaction is developed by the deposition of the inhibitor on the plating surface, and if the inhibitor forms a complex with the complexing agent in the plating solution and the complex is very stable, it is considered that deposition of the inhibitor on the plating surface does not occur. The occurrence of this phenomenon can be predicted by measuring the voltammogram using the material to be plated as a test electrode.

The present invention can also be applied to alloy plating of magnetic materials, amorphous materials, etc.

The present invention will be illustrated by the following examples.

EXAMPLE 1

A conductor circuit was prepared by electroless copper plating using as a test substrate a printed substrate having a via-hole of 60 μm in diameter. The following electroless copper plating solution 1 was used.

| [Plating solution 1] | |
|---|---|
| Copper sulfate pentahydrate (CuSO$_4$.5H$_2$O) | 0.04 mol/l |
| Disodium ethylenediaminetetraacetate (EDTA.2Na) | 0.1 mol/l |
| Formaldehyde (HCHO) | 0.03 mol/l |
| Sodium hydroxide (NaOH) | 0.1 mol/l |
| Lead ion (Pb$^{2+}$: PbSO$_4$) | 1 ppm |

The via-hole in the test substrate was filled with the plating solution 1 by electroless copper plating and evenness of the surface of the substrate was evaluated by observing the surface with a microscope. Method for making the test substrate A is shown below.

Test Substrate A

An adhesive agent mainly composed of an acrylonitrile butadiene rubber-modified phenolic resin was coated on both sides of a polyimide resin laminate having glass fabric (0.6 mm thick) and cured by heating at 160° C. for 10 minutes to obtain a laminate with adhesive layers (about 30 μm thick). Then, this was dipped in a roughening solution containing chromic anhydride and hydrochloric acid to roughen the surface of the adhesive layers.

Then, the laminate was treated with an acidic aqueous solution containing a catalyst HS101B manufactured by Hitachi Chemical Co., Ltd. as a catalyst for electroless copper plating for 10 minutes, washed with water and then dried at 120° C. for 20 minutes. Both sides of the resulting substrate were laminated with a dry film photoresist SR-3000 of 20 μm thick (manufactured by Hitachi Chemical Co., Ltd.), exposed through a pattern mask having a pattern for via-hole of 60 μm in diameter, and developed to obtain test substrate A covered with the resist on the surface except for the via-hole portion.

A plurality of the test substrates A were simultaneously introduced into the plating solution and taken out successively with lapse of given times, and difference in level between the plating resist and the plated portion was measured by a contact surface roughness meter. Thickness of the plating film was obtained from the obtained difference in level and the thickness of resist of 20 μm.

Simultaneously with plating of the test substrates A, stainless steel sheets applied with usual catalyst were also subjected to electroless copper plating. Thickness of the plating on the stainless steel sheet was measured by electronic thickness tester. The above copper plating was conducted at a solution temperature of 90° C. and under a load of 1 dm$^2$/l with stirring by blowing air into the plating solution.

Figure 5:
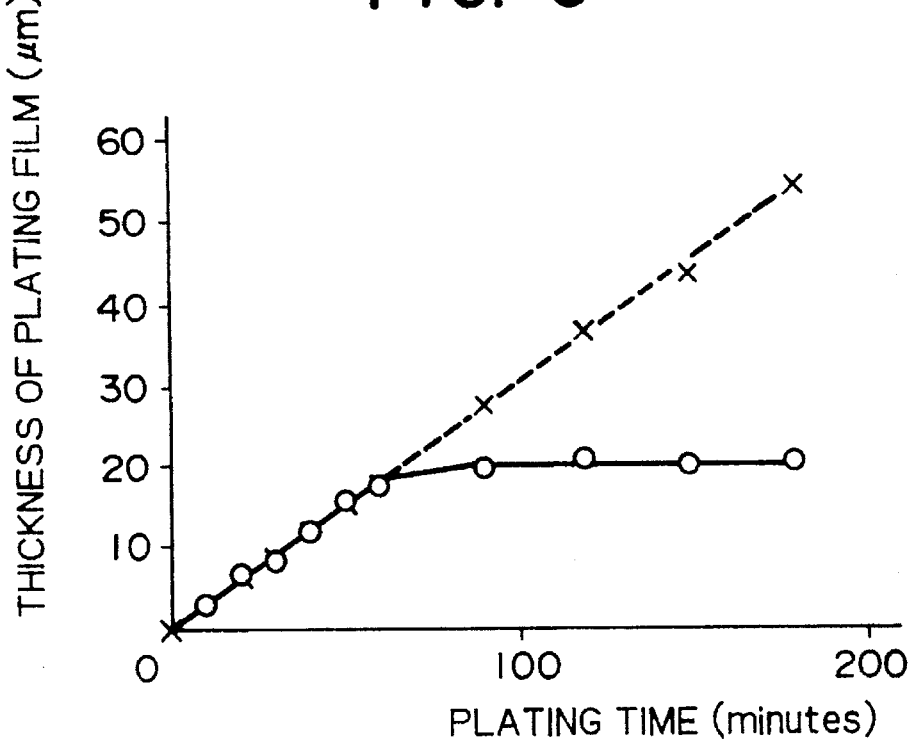
FIG. 5 is a graph which shows the change with time of the thickness of plating film on a via-hole part and on a stainless steel sheet in an example of the present invention.
Figure 6:
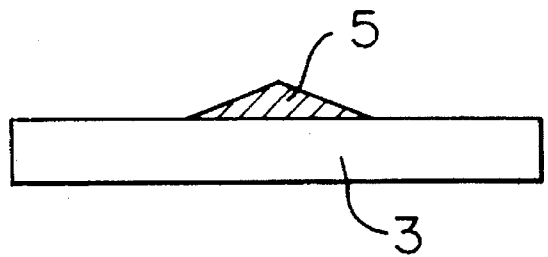
FIG. 6 is a diagrammatic cross-sectional view which shows the shape of deposited plating metal on a flat substrate using a nickel plating solution containing a conventional reaction inhibitor.

Change with time of the thickness of plating film on the via-hole portion and that on the stainless steel sheet is shown in FIG. 5. It can be seen that on the stainless steel sheet, thickness of plating film increases at a constant rate while on the via-hole portion of the test substrate, thickness of the plating film does not increase over 20 μm which is the thickness of the resist film and the plating reaction stops at the point when it reaches the thickness of the resist film. In FIG. 5, the symbol x indicates the measured value on the stainless steel sheet and the symbol o indicates the measured value on the via-hole portion.

Next, the depth profile of the composition of the conductor metal (copper and lead in this case) deposited on the via-hole portion was analyzed by micro Auger photoelectron spectroscopy (μ-APS). As a result, lead was present in a trace amount of about the limit of detection in the inner part of the conductor, but the amount in the surface layer was about 20 times the amount in the inner part of the conductor.

EXAMPLE 2

Formation of a conductor circuit was carried out by electroless copper plating using a printed substrate for full additive as a test substrate. The electroless copper plating used was the same as in Example 1. A pattern was formed on the test substrate by electroless copper plating and evenness of the surface of the substrate was evaluated by observing it with a microscope. Method for making test substrate B will be shown below.

Test Substrate B

A via-hole was made by a drill at a given position in the same laminate with adhesive layers (about 30 μm thick) as used in Example 1, and then the laminate was dipped in a roughening solution containing chromic anhydride and hydrochloric acid to roughen the surface of the adhesive layers.

Then, in the same manner as in Example 1, the substrate was treated with the catalyst solution for electroless copper plating, and the both sides of the substrate were laminated with a dry film photoresist SR-3000 of 35 μm thick and exposed through a pattern mask having a wiring of 60 μm in width and developed to cover the surface of the surface except for the pattern portion with the resist.

The above test substrate B and a stainless steel sheet applied with a usual catalyst were dipped in the copper plating solution to carry out electroless copper plating at a solution temperature of 70° C. and under a load of 1 dm$^2$/l in the same manner as Example 1. Thickness of plating film was measured in the same manner as in Example 1. As in Example 1, the plating reaction stopped when the surface of the conductor metal reached the level of the surface of the resist, and as a result, a conductor circuit having a high evenness between the surface of the conductor metal and the surface of the resist could be formed.

EXAMPLE 3

The procedure of Example 1 was repeated, except that mercury ion was used as the inhibitor in place of the lead ion. As in Example 1, the plating reaction stopped when the surface of the conductor metal reached the level of the surface of the resist, and as a result, a conductor circuit having a high evenness between the surface of the conductor metal and the surface of the resist could be formed.

EXAMPLE 4

The procedure of Example 1 was repeated except that silver ion was used as the inhibitor in place of the lead ion. As in Example 1, the plating reaction stopped when the surface of the conductor metal reached the level of the surface of the resist, and as a result, a conductor circuit having a high evenness between the surface of the conductor metal and the surface of the resist could be formed.

EXAMPLE 5

The procedure of Example 1 was repeated, except that tin ion was used as the inhibitor in place of the lead ion. As in Example 1, the plating reaction stopped when the surface of the conductor metal reached the level of the surface of the resist, and as a result, a conductor circuit having a high evenness between the surface of the conductor metal and the surface of the resist could be formed.

EXAMPLE 6

The procedure of Example 1 was repeated, except that zinc ion was used as the inhibitor in place of the lead ion. As in Example 1, the plating reaction stopped when the surface of the conductor metal reached the level of the surface of the resist, and as a result, a conductor circuit having a high evenness between the surface of the conductor metal and the surface of the resist could be obtained.

COMPARATIVE EXAMPLE 1

The same experiment as in Example 1 was conducted using the following plating solution 2. The concentration of the inhibitor (lead ion) was less than $10^{-6}$ mol/l.

| [Plating solution 2] | |
| --- | --- |
| Copper sulfate pentahydrate | 0.04 mol/l |
| Disodium ethylenediaminetetraacetate | 0.1 mol/l |
| Formaldehyde | 0.03 mol/l |
| Sodium hydroxide | 0.1 mol/l |
| Lead ion ($Pb^{2+}$: $PbSO_4$) | 0.05 ppm |

As a result, the thickness of the plating film on the via-hole portion increased at nearly the same rate as the thickness of the plating film on the stainless steel sheet, but the plating reaction at the via-hole portion could not be stopped.

COMPARATIVE EXAMPLE 2

The same experiment as in Example 1 was conducted using the following plating solution 3. The concentration of the inhibitor (lead ion) was more than $2 \times 10^{-4}$ mol/l.

| [Plating solution 3] | |
| --- | --- |
| Copper sulfate pentahydrate | 0.04 mol/l |
| Disodium ethylenediaminetetraacetate | 0.1 mol/l |
| Formaldehyde | 0.03 mol/l |
| Sodium hydroxide | 0.1 mol/l |
| Lead ion ($Pb^{2+}$: $PbSO_4$) | 1 g/l |

As a result, at the time of plating the inside of the hole, the surface of copper was covered with lead and the plating reaction stopped and thus, the via-hole could not be filled with plating.

EXAMPLE 7

The procedure of Example 1 was repeated, except that iron ion was used as the inhibitor for cathodic partial reaction in place of the lead ion. As in Example 1, the plating reaction stopped when the surface of the conductor metal reached the level of the surface of the resist, and as a result, a conductor circuit having a high evenness between the surface of the conductor metal and the surface of the resist could be formed.

EXAMPLE 8

The procedure of Example 1 was repeated, except that cobalt ion was used as the inhibitor for cathodic partial reaction in place of the lead ion. As in Example 1, the plating reaction stopped when the surface of the conductor metal reached the level of the surface of the resist, and as a result, a conductor circuit having a high evenness between the surface of the conductor metal and the surface of the resist could be formed.

EXAMPLE 9

The procedure of Example 1 was repeated, except that nickel ion was used as the inhibitor for cathodic partial reaction in place of the lead ion. As in Example 1, the plating reaction stopped when the surface of the conductor metal reached the level of the surface of the resist, and as a result, a conductor circuit having a high evenness between the surface of the conductor metal and the surface of the resist could be formed.

EXAMPLE 10

The procedure of Example 1 was repeated, except that bismuth ion was used as the inhibitor for cathodic partial reaction in place of the lead ion. As in Example 1, the plating reaction stopped when the surface of the conductor metal reached the level of the surface of the resist, and as a result, a conductor circuit having a high evenness between the surface of the conductor metal and the surface of the resist could be obtained.

EXAMPLE 11

Electroless nickel plating was carried out using the same test substrate A as used in Example 1. The following plating solution 4 was used.

| [Plating solution 4] | |
| --- | --- |
| Nickel sulfate | 0.075 mol/l |
| Nickel acetate | 0.015 mol/l |
| Succinic acid | 0.12 mol/l |
| Hypophosphorous acid | 0.1 mol/l |
| Ammonia | For adjusting pH to 4.5 |
| Lead ion | 1 ppm |

The same experiment as in Example 1 was conducted using the above plating solution at a solution temperature of 90° C. under stirring of the plating solution.

As in Example 1, increase of the thickness of the plating film on the via-hole portion stopped at 20 μm and a conductor circuit having a high evenness between the surface of the conductor metal and the surface of the resist was obtained.

COMPARATIVE EXAMPLE 3

The same experiment as in Example 1 was conducted using the same plating solution as used in Example 11 without carrying out the stirring of the plating solution. As a result, since the plating solution was not stirred, the plating on the via-hole portion was in the conical form. Therefore, the surface of the conductor circuit was uneven and the surface must be subjected to abrasion treatment for making a conductor circuit of multilayer.

EXAMPLE 12

The procedure of Example 11 was repeated, except that copper ion was used as the inhibitor in place of the lead ion. As in Example 11, the plating reaction stopped when the surface of the conductor metal reached the level of the surface of the resist, and as a result, a conductor circuit having a high evenness between the surface of the conductor metal and the surface of the resist could be formed.

EXAMPLE 13

The procedure of Example 11 was repeated except that mercury ion was used as the inhibitor in place of the lead ion. As in Example 11, the plating reaction stopped when the surface of the conductor metal reached the level of the surface of the resist, and as a result, a conductor circuit having a high evenness between the surface of the conductor metal and the surface of the resist could be formed.

EXAMPLE 14

The procedure of Example 11 was repeated, except that silver ion was used as the inhibitor in place of the lead ion. As in Example 11, the plating reaction stopped when the surface of the conductor metal reached the level of the surface of the resist, and as a result, a conductor circuit having a high evenness between the surface of the conductor metal and the surface of the resist could be formed.

EXAMPLE 15

The procedure of Example 11 was repeated, except that tin ion was used as the inhibitor in place of the lead ion. As in Example 11, the plating reaction stopped when the surface of the conductor metal reached the level of the surface of the resist, and as a result, a conductor circuit having a high evenness between the surface of the conductor metal and the surface of the resist could be formed.

EXAMPLE 16

The procedure of Example 11 was repeated, except that zinc ion was used as the inhibitor in place of the lead ion. As in Example 11, the plating reaction stopped when the surface of the conductor metal reached the level of the surface of the resist, and as a result, a conductor circuit having a high evenness between the surface of the conductor metal and the surface of the resist could be obtained.

EXAMPLE 17

The procedure of Example 11 was repeated, except that bismuth ion was used as the inhibitor in place of the lead ion. As in Example 11, the plating reaction stopped when the surface of the conductor metal reached the level of the surface of the resist, and as a result, a conductor circuit having a high evenness between the surface of the conductor metal and the surface of the resist could be formed.

EXAMPLE 18

The procedure of Example 11 was repeated, except that antimony ion was used as the inhibitor in place of the lead ion. As in Example 11, the plating reaction stopped when the surface of the conductor metal reached the level of the surface of the resist, and as a result, a conductor circuit having a high evenness between the surface of the conductor metal and the surface of the resist could be formed.

EXAMPLE 19

The procedure of Example 11 was repeated, except that cobalt ion was used as the inhibitor in place of the lead ion. As in Example 11, the plating reaction stopped when the surface of the conductor metal reached the level of the surface of the resist, and as a result, a conductor circuit having a high evenness between the surface of the conductor metal and the surface of the resist could be obtained.

What is claimed is:

1. A method for forming a conductor circuit by depositing and filling a conductor metal in recessions of insulator in the form of grooves or holes using an electroless plating solution, the conductor metal being deposited and filled in the recession at the same level as the surface of the insulator, wherein said electroless plating solution contains an inhibitor which inhibits the cathodic partial reaction which is a metal deposition reaction and the electroless plating is carried out with stirring the plating solution.

2. A method according to claim 1, wherein concentration of the inhibitor in the electroless plating solution is $1\times10^{-6}$ to $2\times10^{-4}$ mol/l.

3. A method according to claim 1, wherein the metal deposited by electroless plating is copper and the inhibitor is at least one member selected from the group consisting of lead, mercury, silver, zinc, tin, iron, cobalt, nickel and bismuth.

* * * * *